United States Patent
Huang

(10) Patent No.: US 11,581,402 B2
(45) Date of Patent: Feb. 14, 2023

(54) LATERAL SEMICONDUCTOR DEVICE AND METHOD OF MANUFACTURE

(71) Applicant: The University of Texas at Austin, Austin, TX (US)

(72) Inventor: Qin Huang, Austin, TX (US)

(73) Assignee: Board of Regents, The University of Texas System, Houston, TX (US)

( * ) Notice: Subject to any disclaimer, the term of this patent is extended or adjusted under 35 U.S.C. 154(b) by 0 days.

(21) Appl. No.: 17/273,634

(22) PCT Filed: Sep. 5, 2019

(86) PCT No.: PCT/US2019/049672
§ 371 (c)(1),
(2) Date: Mar. 4, 2021

(87) PCT Pub. No.: WO2020/051285
PCT Pub. Date: Mar. 12, 2020

(65) Prior Publication Data
US 2021/0343836 A1    Nov. 4, 2021

Related U.S. Application Data

(60) Provisional application No. 62/727,221, filed on Sep. 5, 2018.

(51) Int. Cl.
*H01L 29/40*    (2006.01)
*H01L 29/872*    (2006.01)
(Continued)

(52) U.S. Cl.
CPC ...... *H01L 29/0619* (2013.01); *H01L 29/1608* (2013.01); *H01L 29/404* (2013.01); *H01L 29/7833* (2013.01); *H01L 29/872* (2013.01)

(58) Field of Classification Search
CPC ............. H01L 29/0619; H01L 29/1608; H01L 29/404; H01L 29/7833; H01L 29/872
(Continued)

(56) References Cited

U.S. PATENT DOCUMENTS 5,801,531 A    9/1998   Ranjan
6,593,594 B1 *  7/2003   Alok ................... H01L 29/7835
                                                        257/77
(Continued)

OTHER PUBLICATIONS

PCT International Search Report and Written Opinion for PCT/US2019/049672, dated Feb. 6, 2020.

*Primary Examiner* — Monica D Harrison
(74) *Attorney, Agent, or Firm* — Patterson + Sheridan, LLP

(57) ABSTRACT

A method and apparatus include an n-doped layer having a first applied charge, and a p⁻-doped layer having a second applied charge. The p⁻-doped layer may be positioned below the n-doped layer. A p⁺-doped buffer layer may have a third applied charge and be positioned below the p⁻-doped layer. The respective charges at each layer may be determined based on a dopant level and a physical dimension of the layer. In one example, the n-doped layer, the p⁻-doped layer, and the p⁺-doped buffer layer comprise a lateral semiconductor manufactured from silicon carbide (SiC).

20 Claims, 7 Drawing Sheets

(51) Int. Cl.
*H01L 29/06* (2006.01)
*H01L 29/16* (2006.01)
*H01L 29/78* (2006.01)

(58) Field of Classification Search
USPC .......................................................... 257/288
See application file for complete search history.

(56) References Cited

U.S. PATENT DOCUMENTS

| | | | |
|---|---|---|---|
| 7,449,762 B1 | 11/2008 | Singh | |
| 9,275,998 B2* | 3/2016 | Kub | .................... H01L 29/7786 |
| 2007/0026600 A1* | 2/2007 | Komori | ............. H01L 21/82385 |
| | | | 438/585 |
| 2010/0148256 A1 | 6/2010 | Chang | |
| 2015/0255547 A1* | 9/2015 | Yuan | ................ H01L 29/66462 |
| | | | 257/76 |

* cited by examiner

LATERAL SEMICONDUCTOR DEVICE AND METHOD OF MANUFACTURE

CROSS-REFERENCE TO RELATED APPLICATION(S)

This application for Patent is a national stage application under 35 U.S.C. 371 of PCT/US2019/049672, filed Sep. 5, 2019, which claims priority to U.S. Provisional Application No. 62/727,221, filed Sep. 5, 2018, which are both herein incorporated by reference in their entireties.

BACKGROUND

The present invention relates generally to electronic devices, and more particularly, to power semiconductor device fabrication.

A power semiconductor device is commonly used as a switch or rectifier in power electronics, such as a switch-mode power supply. Discrete power semiconductors, or power integrated circuits (ICs), are found in systems delivering as little as a few tens of milliwatts (e.g., for a headphone amplifier) up to around a gigawatt (e.g., in a high voltage direct current transmission line).

The materials used to fabricate the semiconductor can dramatically affect its performance, configuration, and use in industry. For instance, gallium nitride (GaN) material enables fast switching, boasts good figure of merit (FOM) parameters, and is well suited for use in lateral semiconductors. A lateral semiconductor has electric contacts on only one side of substrate material. Despite its advantages, GaN semiconductors lack a PN junction. Device reliability can also be a problem with GaN semiconductors, as well as a related lack of avalanche breakdown voltage capability.

Silicon carbide (SiC) material can be more rugged and better suited for high power industry applications than GaN. However, SiC is conventionally used only in vertical power devices (e.g., with contacts on two sides of a substrate wafer). As a result, current travels vertically up through a substrate, incurring resistance and requiring large microchip dimensions. Additionally, device FOM is poor due to a larger parasitic capacitance.

SUMMARY

According to a particular embodiment, an apparatus includes an n-doped layer having a first applied charge and a p$^-$-doped layer having a second applied charge. The doped layer may be positioned below the n-doped layer. A p$^+$-doped buffer layer may have a third applied charge and be positioned below the p$^-$-doped layer. The respective charges at each layer may be determined based on a dopant level and a physical dimension of the layer. In one example, the n-doped layer, the p$^-$-doped layer, and the p$^+$-doped buffer layer comprise a lateral semiconductor manufactured from silicon carbide (SiC).

According to another specific implementation, a method of manufacturing a lateral semiconductor may include providing an n-doped layer, positioning a p$^-$-doped layer below the n-doped layer, and positioning a p$^+$-doped buffer layer below the p$^-$-doped layer. A respective charge of a plurality of charges may be associated with each of the n-doped layer, the p$^-$-doped layer, and the p$^+$-doped buffer layer. The respective charge may be associated with the n-doped layer as a product of a dopant level and a physical dimension of the n-doped layer.

DETAILED DESCRIPTION

An embodiment of a lateral semiconductor includes an n-doped layer having a first applied charge and a p$^-$-doped layer having a second applied charge. The p$^-$-doped layer may be positioned below the n-doped layer. A p$^+$-doped buffer layer may have a third applied charge and be positioned below the p$^-$-doped layer. The respective charges at each layer may be selected during fabrication based on a dopant level and a physical dimension of the layer to achieve a desired avalanche breakdown voltage.

In one example, the n-doped layer, the p$^-$-doped layer, and the p$^+$-doped buffer layer comprise a lateral power semiconductor manufactured from silicon carbide (SiC). Other embodiments of semiconductors may be manufactured from other metals, including gallium nitride (GaN) and gallium oxide (GaO).

An embodiment of the semiconductor system enables SiC to be used in a lateral semiconductor configuration. Use of SiC in this manner realizes relatively robust performance (e.g., due to the existence of a PN junction and established metal-oxide semiconductor field-effect transistor (MOSFET) operating principles) associated with SiC, while avoiding conventional obstacles relating to substrate resistance. The resultant figure of merit (FOM) parameters rival lateral devices that employ GaN, and embodiments are well suited for uses that call for a large current capacity and a high breakdown voltage.

Figure 1:
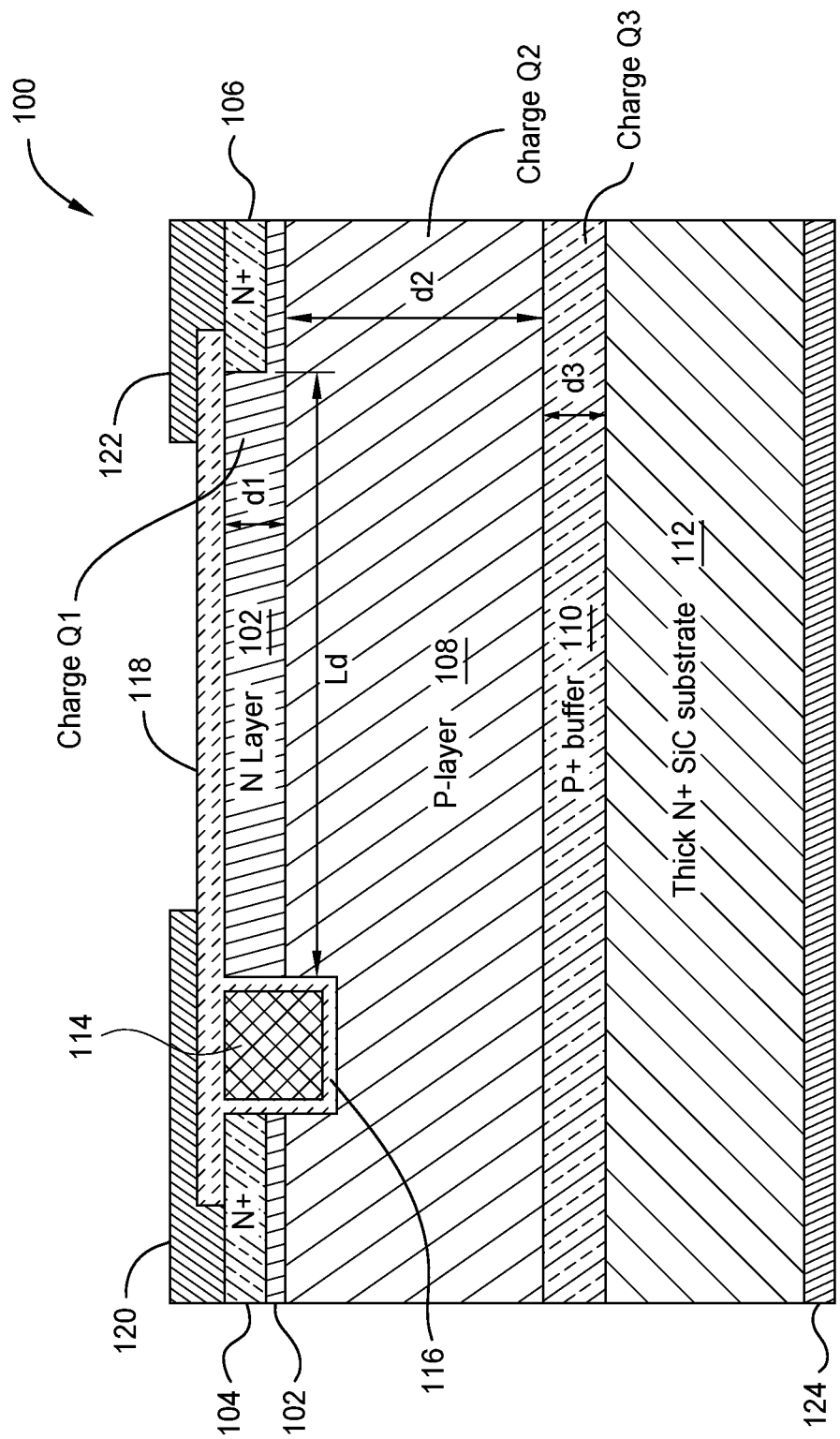
FIG. 1 is a cross-sectional view of an embodiment of a later metal-oxide-semiconductor (MOS) power semiconductor on an n$^+$ substrate that includes an n-doped layer, an n$^+$-doped source region, an n$^+$-doped drain region, a p$^-$-doped layer, and a p$^+$-doped buffer layer.

Turning to the Drawings, FIG. 1 is a cross-sectional view of an embodiment of a semiconductor 100 that includes an n-doped layer 102, an n$^+$-doped source region 104, an n$^+$-doped drain region 106, a p$^-$-doped layer 108, and a p$^+$-doped buffer layer 110. The embodiment of the semiconductor 100 also includes a relatively thick n$^+$-doped substrate 112. The semiconductor 100 may be said to have a lateral configuration because the source region 104, the drain region 106, and a gate region 114 (e.g., semiconductor contacts) are positioned along one surface of the semiconductor 100. Each of the n-doped layer 102, the p$^-$-doped layer 108, and the p$^+$-doped buffer layer 110 may be associated with a charge, respectively, Q1, Q2, and Q3. As explained herein, the charges Q1, Q2, Q3 may be selected during fabrication according to doping level and layer thicknesses d1, d2, d3 to manipulate electrical properties of the semiconductor 100, such as a desired avalanche breakdown voltage. Superscript plus and minus symbols are used herein to denote relative doping concentration in semiconductors. For example, n$^+$ denotes an n-type semiconductor with a high, often degenerate, doping concentration. Similarly, p$^-$ may indicate a very lightly doped p-type material.

The gate region 114, or electrode, of the semiconductor 100 may be formed or otherwise positioned within a trench, or channel 116. An illustrative channel 116 may include a metal-oxide-semiconductor (MOS) channel. The gate region 114 of a particular embodiment may comprise polysilicon. The channel 116 may be etched deeper than the thickness d1 of the n-doped layer 102. Channel current may travel from the drain region 106 to the source region 104 with little capacitance.

A passivation layer 118 of the semiconductor 100 may protect surfaces of the semiconductor 100 from electrical and chemical contaminants. The passivation layer 118 may comprise an oxide with a varying thickness (e.g., ranging from 0.2 um to 1 um).

The embodiment of the semiconductor 100 of FIG. 1 is constructed on n$^+$-doped substrate 112 comprising SiC. Though another embodiment may include a contact on the bottom of the substrate, the substrate 112 of FIG. 1 provides support and does not have current flowing within it. Another embodiment may include a p$^+$-doped substrate. Still another embodiment of a semiconductor may not include a substrate layer. The substrate of an embodiment may include a contact, where desired. The substrate 112 of FIG. 1 includes a field plate 124.

The embodiment of the semiconductor 100 in FIG. 1 is considered to be a four terminal device since it includes the source region 104, the gate region 114, the drain region 106, and the substrate 112. Another embodiment of a semiconductor may be a three terminal device if it includes a source region, a gate region, a drain region, and no substrate. Still another embodiment of a three terminal semiconductor device may include a configuration having a gate region and a drain region, as well as a source region and a substrate that are connected together with the source.

The charges Q1, Q2, and Q3 may be determined in part by each concentration, or level of doping N1, N2, and N3 of each layer 102, 108, and 110. The charges may also be a product of the respective thickness d1, d2, d3 of each layer 102, 108, 110. For example: Q1=N1*d1; Q2=N2*d2; and Q3=N3*d3, where N1, N2, and N3 are the respective doping levels of the n-doped layer 102, the p$^-$-doped layer 108, and the p$^+$-doped buffer layer 110. Lengths d1, d2 and d3 are the respective thickness of each layer 102, 108, 110.

The charge Q3 may be adjusted to control the NPN punch through voltage between the drain/source to the substrate. Punch through may occur when depletion layers around the drain and substrate regions 106, 110 merge into a single depletion region. The charges Q1 and Q2 may be controlled to achieve a high avalanche breakdown between the drain region 106 and the source region 104. A length Ld of the n-doped layer 102 may be set to achieve a high avalanche breakdown voltage. Both or either a field plate 120 proximate the source region 104 and a field plate 122 proximate the drain region 106 may be optimized to achieve the highest breakdown. The field plates 120, 122 may extend into the n-doped layer 102 to affect magnetic field distribution.

At least one of the doping N1 and the thickness d1 of the n-doped layer 102 may be adjusted to affect Q1. In this manner, Q1 may be maximized to reduce a resistance of the N layer. The N layer thickness d1 may be kept low (e.g., around 0.4 um) to reduce a depth of the trench (e.g., around 0.6 um).

While the layers 102, 104, 106, 108, 110, 112, 114, 116, 118 of an embodiment may be formed by using ion-implantation, a preferred embodiment may grow the layers 102, 104, 106, 108, 110, 112, 114, 116, 118 using an epitaxial method. For example, metal organic chemical vapor deposition (MOCVD) is a process used for creating high purity crystalline compound semiconducting thin films and micro/nano structures. The epitaxial technique may result in a desirable layer quality in the SiC.

Figure 2:
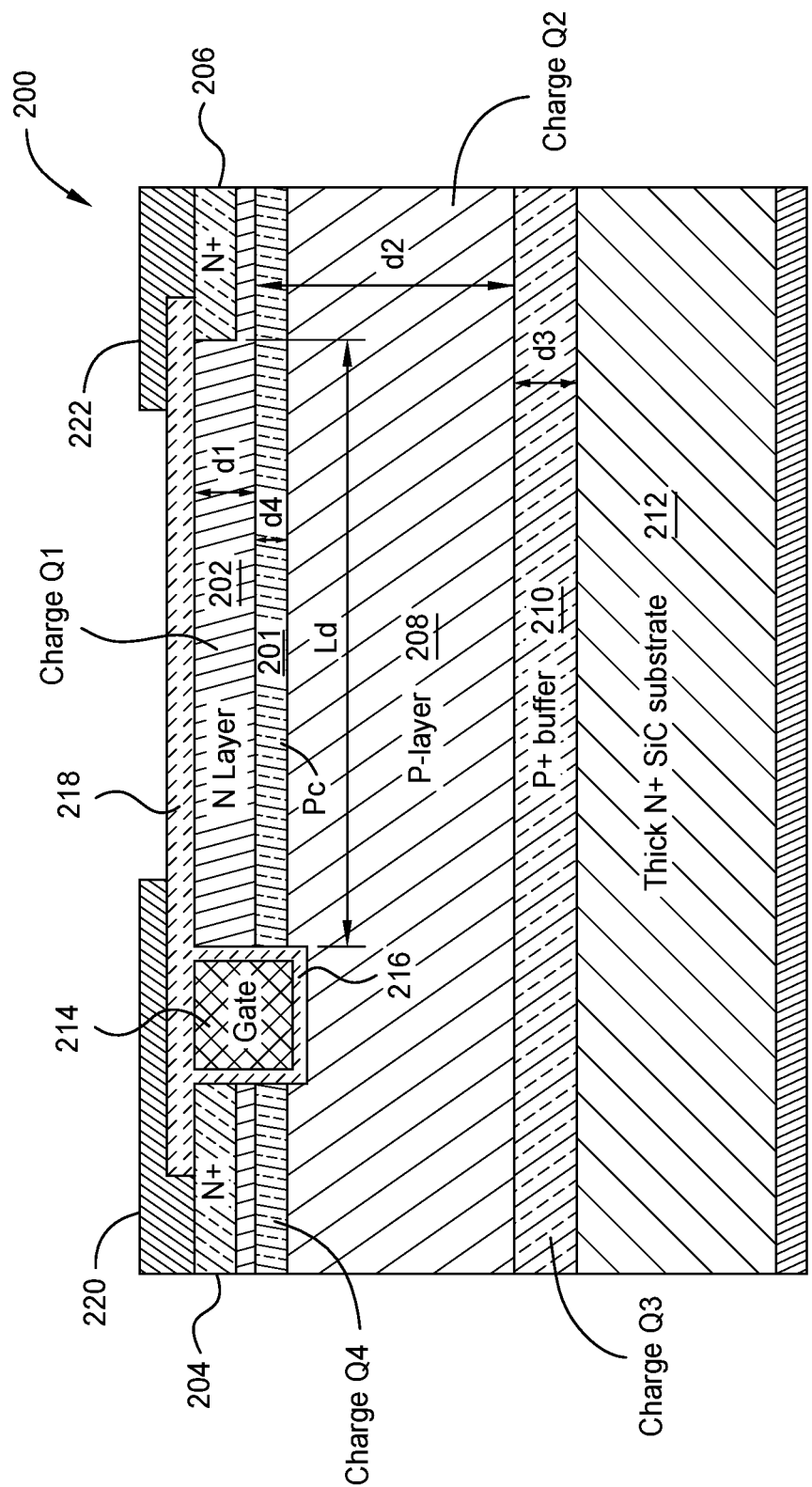
FIG. 2 is a cross-sectional view of an embodiment of a lateral power semiconductor that is similar to the lateral power semiconductor of FIG. 1, but that includes an additional p-doped layer positioned between the n-doped layer and the p$^-$-doped layer.

FIG. 2 is a cross-sectional view of an embodiment of a semiconductor 200 that is similar to the lateral power semiconductor 100 of FIG. 1, but that includes an additional p-doped layer 201 positioned between the n-doped layer 202 and the p$^-$-doped layer 208. The p-doped layer 201 may be epitaxially grown on the p$^-$-doped layer 208 to control a threshold voltage of a MOSFET channel 216. The additional p-doped layer 201 may have an associated charge Q4 that is set to reduce effects on an avalanche breakdown voltage.

The semiconductor 200 of FIG. 2 additionally includes an n$^+$-doped source region 204, an n$^+$-doped drain region 206, and a p$^+$-doped buffer layer 210. The embodiment of the semiconductor 200 also includes a relatively thick n$^+$-doped substrate 212. Field plates 220, 222 may extend into the n-doped layer 202 to affect magnetic field distribution. The semiconductor 200 may have a lateral configuration because the source region 204, the drain region 206, and a gate region 214 (e.g., semiconductor contacts) are positioned along one surface of the semiconductor 200.

In addition to the charge Q4 at the p-doped layer 201, each of the n-doped layer 202, the p$^-$-doped layer 208, and the p$^+$-doped buffer layer 210 may be associated with a charge, respectively, Q1, Q2, and Q3. As explained herein, the charges Q1, Q2, Q3, Q4 may be fabricated according to doping level and layer thicknesses d1, d2, d3, d4 to manipulate electrical properties of the semiconductor 200, such as a desired avalanche breakdown voltage.

The gate region 214 of the semiconductor 200 may be formed or otherwise positioned within the MOSFET channel 216. The gate region 214 of a particular embodiment may comprise polysilicon. The MOSFET channel 216 may be etched deeper than the thickness d1 of the n-doped layer 202. Channel current may travel from the drain region 206 to the source region 204 with small resistance and small parasitic capacitance.

The semiconductor 200 may include a passivation layer 218 formed using an oxide with a varying thickness. The semiconductor 200 of FIG. 2 is constructed on n$^+$-doped substrate 212 comprising SiC. Though another embodiment may include a contact on the bottom of the substrate, the substrate 212 of FIG. 2.

The charges Q1, Q2, Q3, Q4 may be determined in part by each concentration, or level of doping N1, N2, N3, N4 of each layer 202, 208, 210, 201, respectively. The charges may also be a product of the respective thickness d1, d2, d3, d4 of each layer 202, 208, 210, 201, respectively. For example: Q1=N1*d1; Q2=N2*d2; Q3=N3*d3, and Q4=N4*d4, where N1, N2, N3, and N4 are the respective doping levels of the n-doped layer 202, the p⁻-doped layer 208, the p⁺-doped buffer layer 210, and the p-doped layer 201. Lengths d1, d2, d3, and d4 are the respective thickness of each layer 202, 208, 210, 201.

Figure 3:
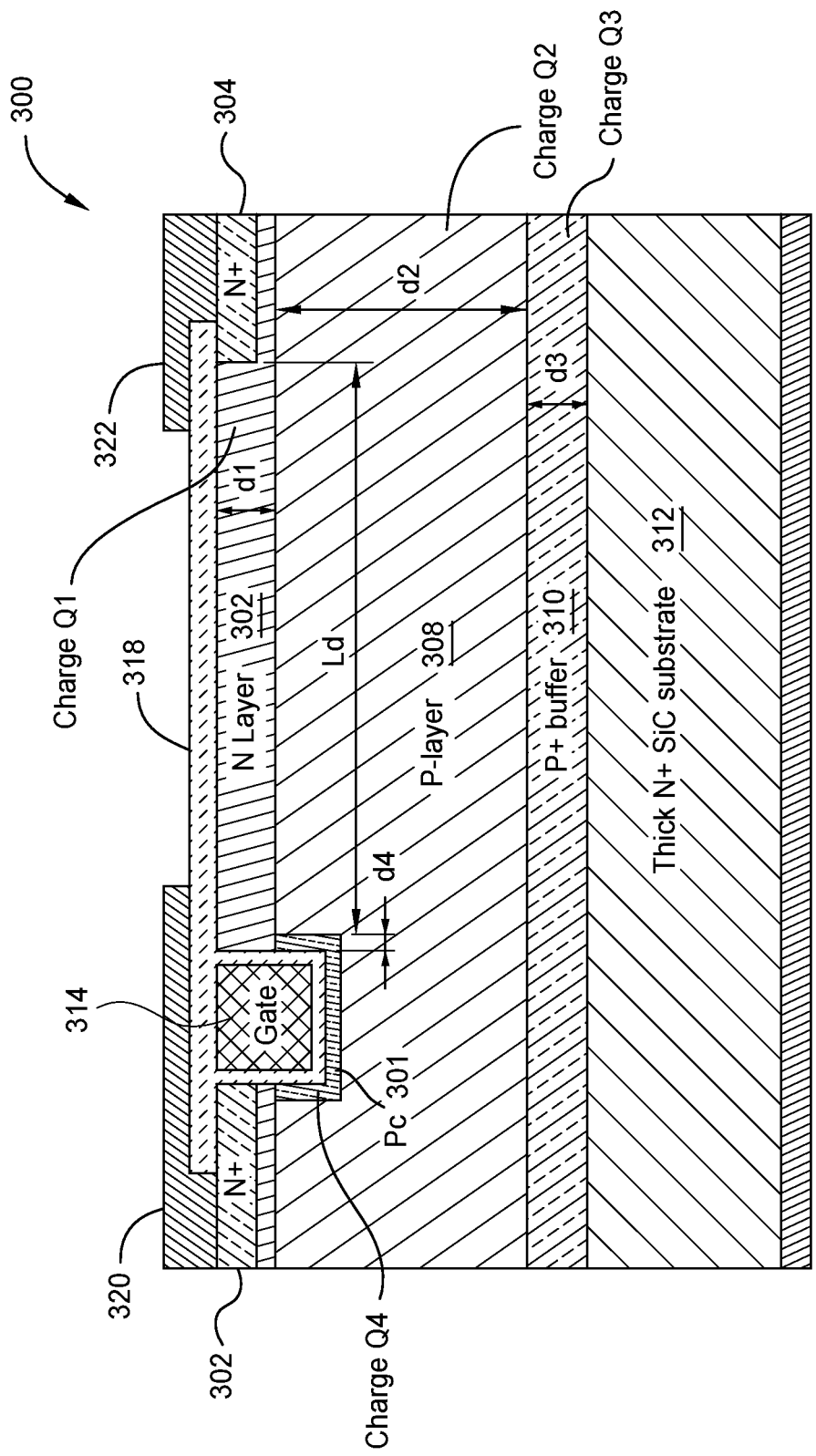
FIG. 3 is a cross-sectional view of an embodiment of a lateral power semiconductor that is similar to the lateral power semiconductor of FIG. 1, but that includes an additional p-doped layer that is ion implanted into a bottom of a trench, or channel, of a gate region.

FIG. 3 is a cross-sectional view of an embodiment of a semiconductor 300 that is similar to the lateral power semiconductor 100 of FIG. 1, but that includes an additional p-doped layer 301 that may be ion implanted into a bottom of a trench, or channel, of a gate region 314. The additional p-doped layer 301 may have an associated charge Q4 to control a threshold voltage.

The semiconductor 300 of FIG. 3 additionally includes an n-doped layer 302, an n⁺-doped source region 304, an n⁺-doped drain region 306, and a p⁺-doped buffer layer 312. The embodiment of the semiconductor 300 also includes a relatively thick n⁺-doped substrate 312. Field plates 320, 322 may extend into the n-doped layer 302 to affect magnetic field distribution. The semiconductor 300 may have a lateral configuration because the source region 304, the drain region 306, and the gate region 314 are positioned along one surface of the semiconductor 300.

In addition to the charge Q4 at the p-doped layer 301, each of the n-doped layer 302, the p⁻-doped layer 308, and the p⁺-doped buffer layer 310 may be associated with a charge, respectively, Q1, Q2, and Q3. As explained herein, the charges Q1, Q2, Q3, Q4 may be fabricated according to doping level and layer thicknesses d1, d2, d3, d4 to manipulate electrical properties of the semiconductor 300, such as a desired avalanche breakdown voltage.

The gate region 314 of the semiconductor 300 may be formed or otherwise positioned within the channel 301. The gate region 314 of a particular embodiment may comprise polysilicon. The channel 301 may be etched deeper than the thickness d1 of the n-doped layer 302. Channel current may travel from the drain region 306 to the source region 304 with little capacitance.

The semiconductor 300 may include a passivation layer 318 formed using an oxide with a varying thickness. The semiconductor 300 of FIG. 3 is constructed on n⁺-doped substrate 312 comprising SiC. Though another embodiment may include a contact on the bottom of the substrate, the substrate 312 of FIG. 3.

The charges Q1, Q2, Q3, Q4 may be determined in part by each concentration, or level of doping N1, N2, N3, N4 of each layer 302, 308, 310, 301, respectively. The charges may also be a product of the respective thickness d1, d2, d3, d4 of each layer 302, 308, 310, 301, respectively. For example: Q1=N1*d1; Q2=N2*d2; Q3=N3*d3, and Q4=N4*d4, where N1, N2, N3, and N4 are the respective doping levels of the n-doped layer 302, the p⁻-doped layer 308, the p⁺-doped buffer layer 310, and the p-doped layer 301. Lengths d1, d2, d3, and d4 are the respective thickness of each layer 302, 308, 310, 301.

Figure 4:
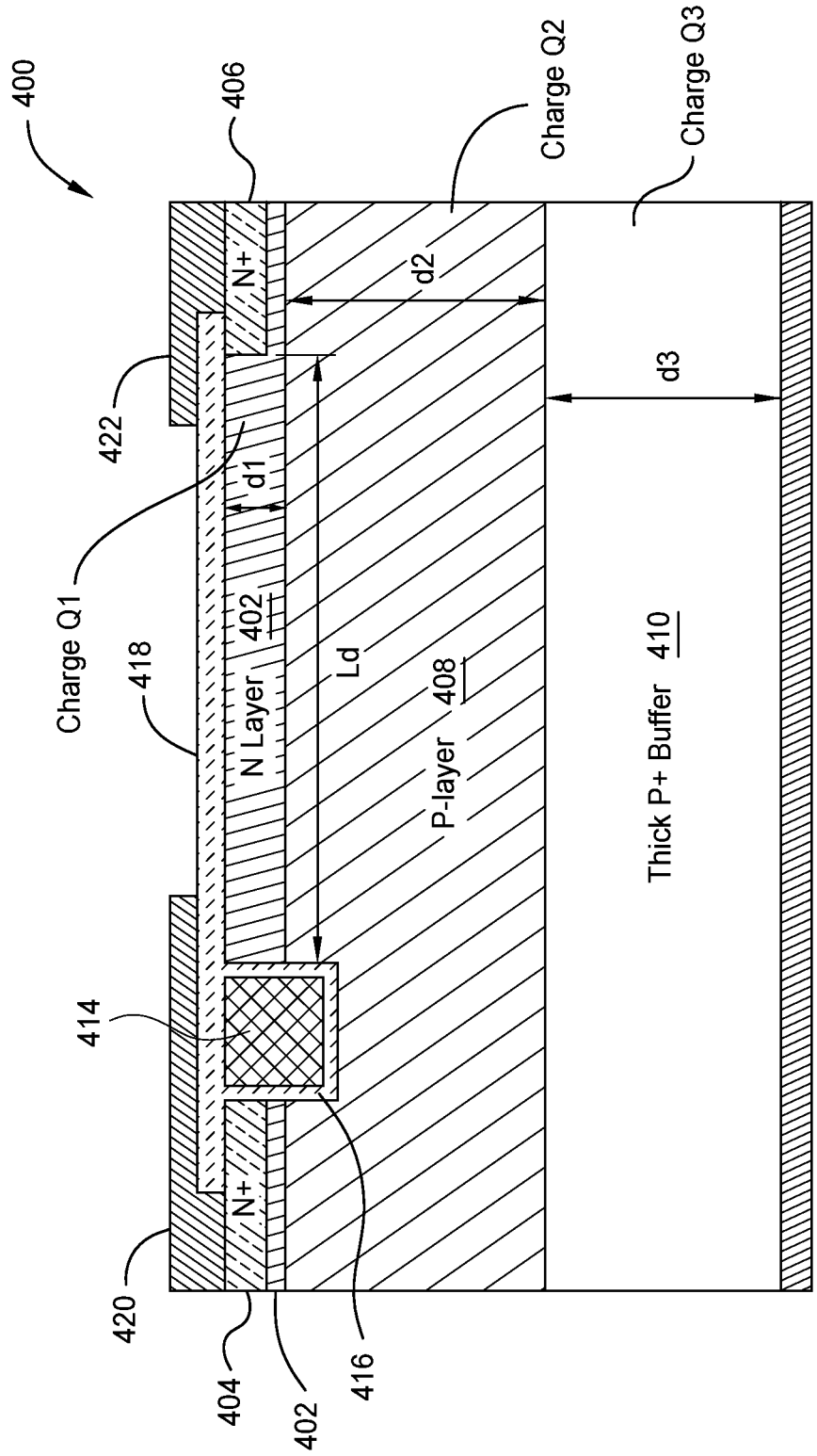
FIG. 4 is a cross-sectional view of another embodiment of a lateral power semiconductor that is similar to the lateral power semiconductor of FIG. 1, except the p$^+$-doped buffer layer is relatively thicker and there is no n$^+$ substrate.

FIG. 4 is a cross-sectional view of another embodiment of a semiconductor 400 that includes an n-doped layer 402, an n⁺-doped source region 404, an n⁺-doped drain region 406, and a p⁻-doped layer 408. The semiconductor 400 is similar to the semiconductor 100 of FIG. 1, except for the p⁺-doped buffer layer 410 is relatively thicker. Additionally, the buffer layer 410 is used instead of the substrate 112 of FIG. 1.

The semiconductor 400 may have a lateral configuration because the source region 404, the drain region 406, and a gate region 414 (e.g., semiconductor contacts) are positioned along one surface of the semiconductor 400. Each of the n-doped layer 402, the p⁻-doped layer 408, and the p⁺-doped buffer layer 410 may be associated with a charge, respectively, Q1, Q2, and Q3. As explained herein, the charges Q1, Q2, Q3 may be fabricated according to doping level and layer thicknesses d1, d2, d3 to manipulate electrical properties of the semiconductor 400, such as a desired avalanche breakdown voltage.

The gate region 414, or electrode, of the semiconductor 400 may be formed or otherwise positioned within a trench, or channel 416. An illustrative channel 416 may include a metal-oxide-semiconductor (MOS) channel. The gate region 414 of a particular embodiment may comprise polysilicon. The channel 416 may be etched deeper than the thickness d1 of the n-doped layer 402. Channel current may travel from the drain region 406 to the source region 404 with little capacitance.

A passivation layer 418 of the semiconductor 400 may protect surfaces of the semiconductor 400 from electrical and chemical contaminants. The passivation layer 418 may comprise an oxide with a varying thickness (e.g., ranging from 0.2 um to 1 um).

The charges Q1, Q2, and Q3 may be determined in part by each concentration, or level of doping N1, N2, and N3 of each layer 402, 408, and 410. The charges may also be a product of the respective thickness d1, d2, d3 of each layer 402, 408, 410. For example: Q1=N1*d1; Q2=N2*d2; and Q3=N3*d3, where N1, N2, and N3 are the respective doping levels of the n-doped layer 402, the p⁻-doped layer 408, and the p⁺-doped buffer layer 410. Lengths d1, d2 and d3 are the respective thickness of each layer 402, 408, 410.

The charges Q1 and Q2 may be controlled to achieve a highest avalanche breakdown (e.g., very large current) between the drain region 406 and the source region 404. A length Ld of the n-doped layer 402 may be set to achieve a highest avalanche breakdown voltage. Both or either a field plate 420 proximate the source region 404 and a field plate 422 proximate the drain region 406 may be optimized to achieve the highest breakdown. The field plates 420, 422 may extend into the n-doped layer 402 to affect magnetic field distribution.

At least one of the doping N1 and the thickness d1 of the n-doped layer 402 may be adjusted to affect Q1. In this manner, Q1 may be maximized to reduce a resistance of the N layer thickness d1 may be kept low (e.g., around 0.4 um) to reduce a depth of the trench (e.g., around 0.6 um).

Figure 5:
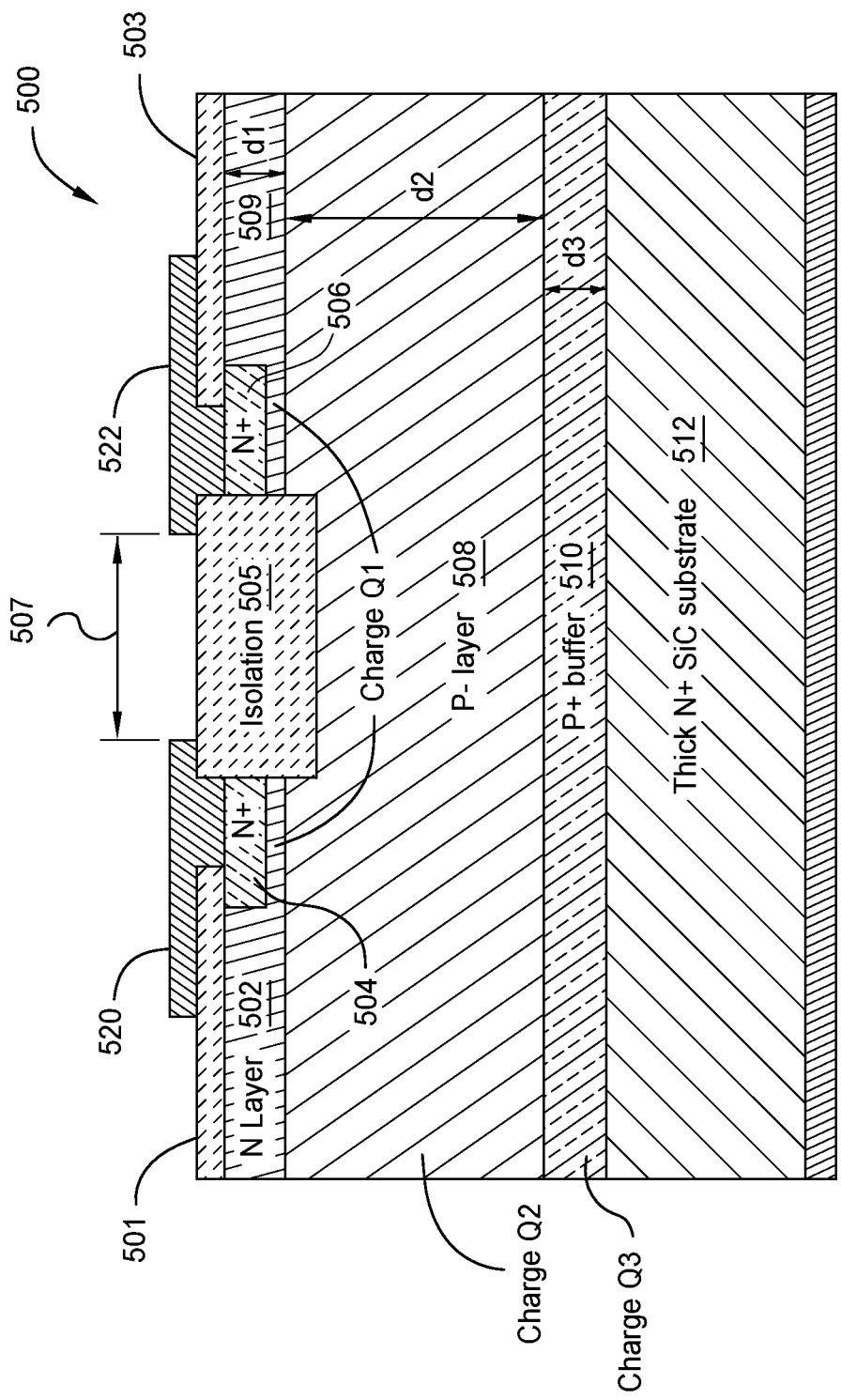
FIG. 5 is a cross-sectional view of an embodiment of lateral semiconductor system having two isolated regions on the same substrate.

FIG. 5 is a cross-sectional view of an embodiment of lateral semiconductor system having two semiconductor regions 501, 503 on the same substrate 512. The first region 501 may be separated along a lateral surface by an isolation trench 505 from the second region 503. The isolation trench 505 of an embodiment may be filled with passivation (e.g., oxide) material. The length of an isolation distance 507, as well as the position and size of the field plates 520, 522 may be optimized to achieve a high isolation voltage. In one embodiment of the system 500, a general location of the first field plate 520 may correspond to a drain terminal of a MOSFET in region 501, and a general location of the second field plate 522 may correspond to a source terminal of a second MOSFET in region 503.

As shown in FIG. 5, the dual semiconductor system includes n-doped layers 502, 509, an n⁺-doped region 504, an n⁺-doped region 506, a p⁻-doped layer 508, and a p⁺-doped buffer layer 510. The embodiment of the system 500 also includes a relatively thick n⁺-doped substrate 512. The semiconductor 500 may have a lateral configuration because the source drain terminals are positioned along one surface. Each of the n-doped layers 502, 509, the p⁻-doped layer 508, and the p⁺-doped buffer layer 510 may be associated with a charge, respectively, Q1, Q2, and Q3. As explained herein, the charges Q1, Q2, Q3 may be fabricated according to doping level and layer thicknesses d1, d2, d3 to manipulate electrical properties of the system 500, such as a desired avalanche breakdown voltage.

The charges Q1, Q2, and Q3 may be determined in part by each concentration, or level of doping N1, N2, and N3 of each layer 502, 508, 509, and 510. The charges may also be a product of the respective thickness d1, d2, d3 of each layer 502, 508, 509, 510. For example: Q1=N1*d1; Q2=N2*d2; and Q3=N3*d3, where N1, N2, and N3 are the respective doping levels of the n-doped layers 502, 509 the p⁻-doped layer 508, and the p⁺-doped buffer layer 510. Lengths d1, d2 and d3 are the respective thickness of each layer 502, 508, 509, 510. As with other embodiments described herein, the layers 502, 504, 506, 508, 509, 510, 512 of an embodiment are preferably grown or otherwise positioned using an epitaxial method, such as MOCVD).

Figure 6:
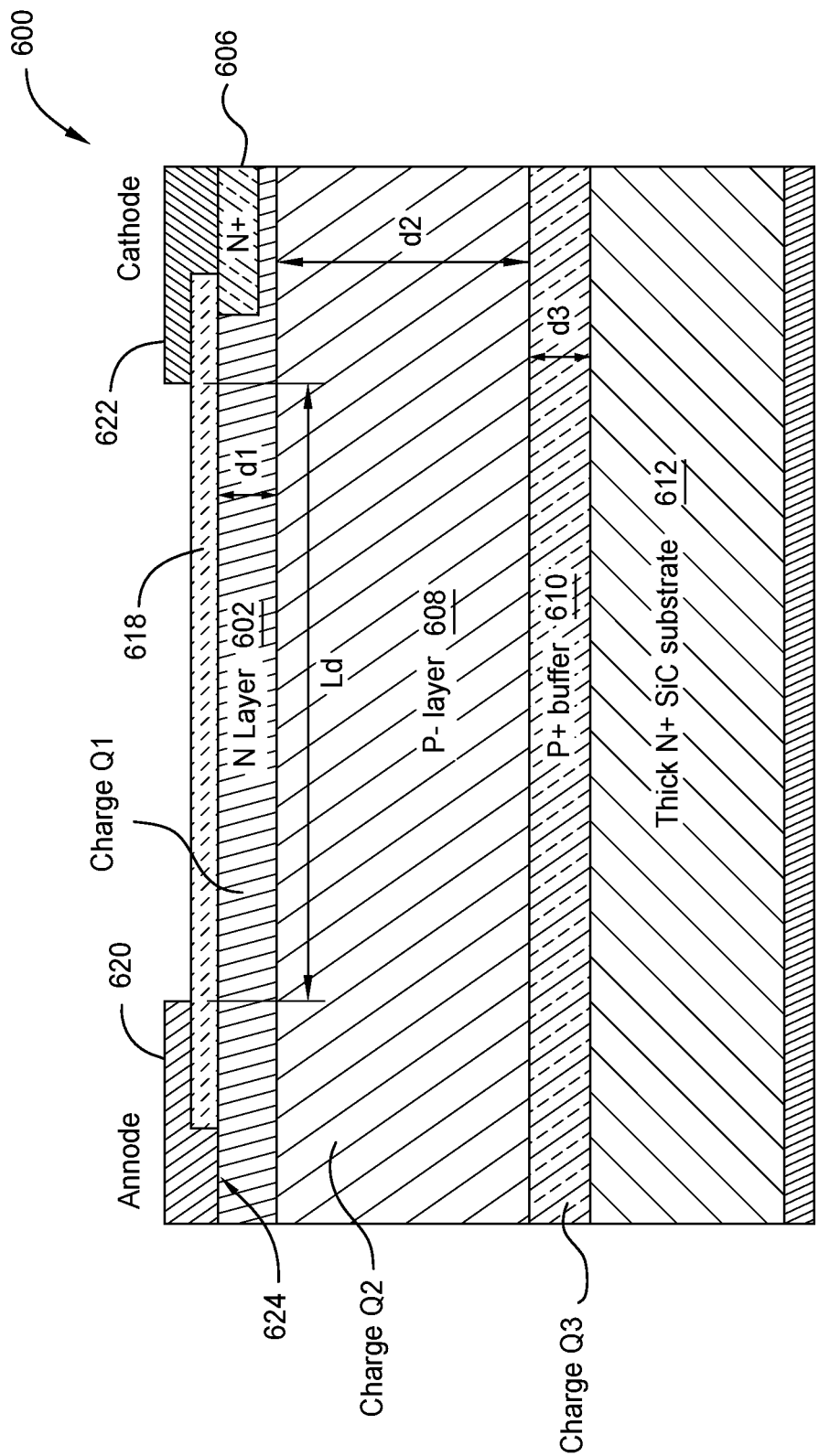
FIG. 6 is a cross-sectional view of an embodiment of a lateral Schottky diode that includes a Schottky contact, an n-doped layer, a p$^-$-doped layer, and a p$^+$-doped buffer layer.

FIG. 6 is a cross-sectional view of an embodiment of a lateral Schottky diode 600 that includes an n-doped layer 602, a p⁻-doped layer 608, a p⁺-doped buffer layer 610, and a Schottky contact 624. The embodiment of the semiconductor 600 also includes an anode, an n⁺-doped cathode region 606, and a relatively thick n⁺-doped substrate 612. The Schottky diode 600 may have a lateral configuration because an anode (Schottky contact) 620 and a cathode, are positioned along one surface of the Schottky diode 600.

Each of the n-doped layer 602, the p⁻-doped layer 608, the p⁺-doped buffer layer 510, and the p-doped layer 601 may be associated with a charge, respectively, Q1, Q2, Q3. As explained herein, the charges Q1, Q2, Q3 may be fabricated according to doping a level and layer thicknesses d1, d2, d3 to manipulate electrical properties of the Schottky diode 600.

A passivation layer 618 of the diode 600 may protect surfaces from electrical and chemical contaminants. The passivation layer 618 may comprise an oxide with a varying thickness. The embodiment of the semiconductor 600 of FIG. 6 is constructed on n⁺-doped substrate 612 comprising SiC. Though another embodiment may include a contact on the bottom of the substrate, the substrate 612 of FIG. 6 provides support and may not have current flowing through it. The diode 600 may include an anode field plate 620 and a cathode field plate 622 to affect magnetic field distribution.

The charges Q1, Q2, Q3 may be determined in part by each concentration or level of doping N1, N2, N3 of each layer 602, 608, 610, respectively. The charges may also be a product of the respective thickness d1, d2, d3 of each layer 602, 608, 610, respectively. For example: Q1=N1*d1; Q2=N2*d2; and Q3=N3*d3, where N1, N2, and N3 are the respective doping levels of the n-doped layer 602, the p⁻-doped layer 608, and the p⁺-doped buffer layer 610. Lengths d1, d2, d3 are the respective thickness of each layer 602, 608, 610.

As with all embodiments described herein, the layers 602, 604, 606, 608, 610, 612, 614, 616, 618 may be formed by using ion-implantation, but a preferred embodiment may grow the layers 602, 604, 606, 608, 610, 612, 614, 616, 618 using an epitaxial method, such as MOCVD.

Figure 7:
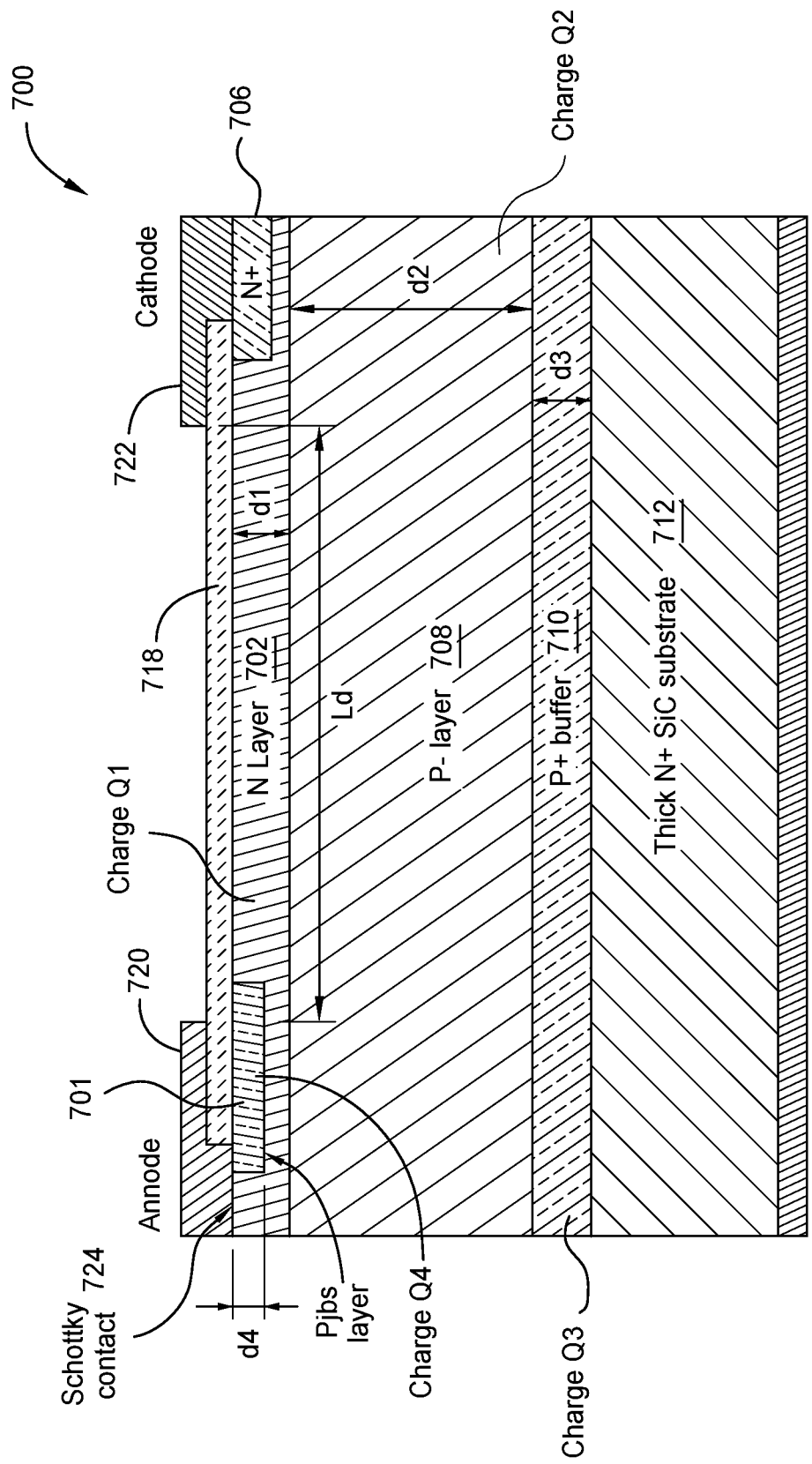
FIG. 7 is a cross-sectional view of an embodiment of a lateral junction barrier Schottky (JBS) diode that includes an n-doped layer, a p$^-$-doped layer, and a p$^+$-doped buffer layer and an addition p-layer adjacent to the Schottky contact.

FIG. 7 is a cross-sectional view of an embodiment of a lateral junction barrier Schottky (JBS) diode 700 that includes an n-doped layer 702, a p⁻-doped layer 708, a p⁺-doped buffer layer 710, and a Schottky contact 724. The embodiment of the semiconductor 700 also includes a p-doped region 701 at an anode, an n⁺-doped cathode region 706, and a relatively thick n⁺-doped substrate 712. The JBS diode 700 may have a lateral configuration because an anode and a cathode are positioned along one surface of the diode 700. The JBS diode 700 may include an anode field plate 720 and a cathode field plate 722 to affect magnetic field distribution.

Each of the n-doped layer 702, the p⁻-doped layer 708, the p⁺-doped buffer layer 510, and the p-doped layer 701 may be associated with a charge, respectively, Q1, Q2, Q3, and Q4. As explained herein, the charges Q1, Q2, Q3, Q4 may be fabricated according to doping a level and layer thicknesses d1, d2, d3, d4 to manipulate electrical properties of the Schottky diode 700.

A passivation layer 718 of the diode 700 may protect surfaces from electrical and chemical contaminants. The passivation layer 718 may comprise an oxide with a varying thickness. The embodiment of the semiconductor 700 of FIG. 7 is constructed on n⁺-doped substrate 712 comprising SiC. Though another embodiment may include a contact on the bottom of the substrate, the substrate 712 of FIG. 7 provides support and may not have current flowing through it.

The charges Q1, Q2, Q3, Q4 may be determined in part by each concentration, or level of doping N1, N2, N3, N4 of each layer 702, 708, 710, 701, respectively. The charges may also be a product of the respective thickness d1, d2, d3, d4 of each layer 702, 708, 710, 701, respectively. For example: Q1=N1*d1; Q2=N2*d2; Q3=N3*d3, and Q4=N4*d4, where N1, N2, N3, and N4 are the respective doping levels of the n-doped layer 702, the p⁻-doped layer 708, the p⁺-doped buffer layer 710, and the p-doped (i.e., pjbs) layer 701. Lengths d1, d2, d3, and d4 are the respective thickness of each layer 702, 708, 710, 701.

As with all embodiments described herein, the layers 701, 702, 704, 706, 708, 710, 712, 714, 716, 718 may be ground using ion-implantation, but a preferred embodiment may grow the layers 701, 702, 704, 706, 708, 710, 712, 714, 716, 718 using an epitaxial method, such as MOCVD.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described above are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

While the foregoing is directed to embodiments of the present invention, other and further embodiments of the invention may be devised without departing from the basic scope thereof, and the scope thereof is determined by the claims that follow.

What is claimed is:

1. An apparatus comprising:
    an n-doped layer having a first applied charge;
    a p$^-$-doped layer having a second applied charge, wherein the p$^-$-doped layer is positioned below the n-doped layer;
    a p$^+$-doped buffer layer having a third applied charge, wherein the p$^+$-doped buffer layer is positioned below the p$^-$-doped layer; and a field plate positioned below the p$^+$-doped buffer.

2. The apparatus of claim 1, wherein the n-doped layer, the p$^-$-doped layer, and the p$^+$-doped buffer layer comprise a lateral semiconductor.

3. The apparatus of claim 1, wherein the n-doped layer, the p$^-$-doped layer, and the p$^+$-doped buffer layer comprise silicon carbide (SiC).

4. The apparatus of claim 1, wherein the p$^-$-doped layer is directly adjacent to both the p$^+$-doped buffer layer and the n-doped layer.

5. The apparatus of claim 1, further comprising a passivation layer and a field plate, wherein the field plate is positioned to affect avalanche breakdown voltage.

6. The apparatus of claim 1, further comprising a substrate positioned between the p$^+$-doped buffer layer and the field plate.

7. The apparatus of claim 6, wherein the p$^-$-doped and p$^+$-doped buffer layer thicknesses and the second and third applied charges control a punch through from the n-doped layer to the substrate, wherein the n-doped layer is a n$^-$-doped layer and the substrate is p$^+$ doped.

8. The apparatus of claim 1, wherein at least one of the first and second applied charges are applied to affect an avalanche breakdown voltage between a drain terminal and a source terminal.

9. The apparatus of claim 1, wherein a length of the n-doped layer is determined to affect an avalanche breakdown voltage.

10. The apparatus of claim 1, wherein the n-doped layer, the p$^-$-doped layer, and the p$^+$-doped buffer layer are grown using an epitaxial technique.

11. The apparatus of claim 1, further comprising a passivation layer.

12. The apparatus of claim 1, further comprising an additional p-doped layer positioned in between the n-doped layer and the p$^-$-doped layer.

13. The apparatus of claim 1, further comprising a metal-oxide-semiconductor (MOS) gate region, wherein the MOS gate region is deeper than the n-doped layer.

14. The apparatus of claim 13, further comprising an additional p-doped layer positioned below the MOS gate region.

15. The apparatus of claim 1, wherein the n-doped layer, the p$^-$-doped layer, and the p$^+$-doped buffer layer comprise at least one of a lateral Schottky diode or a junction barrier Schottky (JBS) diode.

16. The apparatus of claim 1, further comprising first and second metal-oxide-semiconductor (MOS) structures separated by an isolating structure.

17. The apparatus of claim 1, wherein the n-doped layer, the p$^-$-doped layer, and the p$^+$-doped buffer layer comprise at least one of gallium nitride and gallium oxide.

18. A method of manufacturing a lateral semiconductor, the method comprising:
    providing a p$^+$-doped SiC substrate material;
    epitaxially growing a p$^+$-doped buffer layer on the SiC substrate material;
    epitaxially growing a p$^-$-doped layer on the p$^+$-doped buffer layer;
    epitaxially growing an n-doped layer on the p$^-$-doped layer;
    providing a field plate positioned below the p$^+$-doped layer; and
    associating a respective charge of a plurality of charges with each of the n-doped layer, the p$^-$-doped layer, and the p$^+$-doped buffer layer.

19. The method of claim 18, further comprising determining the respective charge associated with the n-doped layer as a product of a dopant level and a physical dimension of the n-doped layer.

20. An apparatus comprising:
    a p-doped layer having a first applied charge;
    an n$^-$-doped layer having a second applied charge, wherein the n$^-$-doped layer is positioned below the p-doped layer; a gate that extends through the p-doped layer into the n$^-$-doped layer,
        wherein the gate is separated from the p-doped layer and the n$^-$-doped layer by a passivation layer; and
    an p$^+$-doped buffer layer having a third applied charge, wherein the p$^+$-doped buffer layer is positioned below the n$^-$-doped layer.

* * * * *